Feb. 3, 1970 J. W. HUNGER 3,493,964

ANALOG TO DIGITAL CONVERTER APPARATUS

Filed Sept. 13, 1966

4 Sheets-Sheet 1

INVENTOR.
JACK W. HUNGER

BY Bruce C Lutz

ATTORNEY

INVENTOR.
JACK W. HUNGER
BY Bruce C Lutz
ATTORNEY

INVENTOR.
JACK W. HUNGER
BY Bruce C Lutz
ATTORNEY

Feb. 3, 1970 J. W. HUNGER 3,493,964

ANALOG TO DIGITAL CONVERTER APPARATUS

Filed Sept. 13, 1966 4 Sheets-Sheet 4

INVENTOR.
JACK W. HUNGER

BY Bruce C. Lutz

ATTORNEY

United States Patent Office 3,493,964
Patented Feb. 3, 1970

3,493,964

ANALOG TO DIGITAL CONVERTER APPARATUS

Jack W. Hunger, Minneapolis, Minn., assignor to Honeywell Inc., Minneapolis, Minn., a corporation of Delaware Filed Sept. 13, 1966, Ser. No. 579,011
Int. Cl. H04l 3/00; G06f 7/38; G06g 7/00
U.S. Cl. 340—347 3 Claims

ABSTRACT OF THE DISCLOSURE

A tracking A/D converter is shown wherein the error signal is coupled to one or more triggers. If the error signal exceeds a predetermined magnitude, the trigger provides a signal to the counter which is used as a forced or fast carry to advance the counter at a greater counting rate than the counting rate otherwise used for tracking the analog signal.

This invention relates to control apparatus and more specifically to analog-to-digital (A/D) converters which have the capability of digitally tracking an analog input signal.

Two general classes of A/D converters are known in the prior art. A first class of converters operates on a sampling principle. A sample of the analog voltage to be converted is taken at a discrete time and is held while the converter drives a digital register through a sequence of steps. At the end of the sequence of steps the number contained in the digital register is indicative or representative of the sampled analog voltage level. The digital output signal is available only at the end of the sequence of steps. After the first sample has been completely quantized or digitized, a second sample is taken and the process is repeated.

In some applications the A/D converter in the system must provide a more or less continuous digital output signal so that the digital signal may be used at any time and not just at the end of a conversion interval. A second class of A/D converters, known as continuous or tracking A/D converters, operates on a servo-type principle. The essence of this type of converter is an up/down or reversing counter which is continuously servoed to provide a more or less continuous digital output signal. In this type of A/D converter the digtial output signal is usually converted into an analog signal indicative or representative of the digital signal. This analog signal is compared to the analog input signal in a comparison section of the converter. The comparison section provides output signals which cause the counter to count up or down. The direction of counting is controlled such that the analog signal indicative of the digital signal becomes more nearly equal to the analog input signal. While this type of converter may be referred to as a continuous converter, it is not truly continuous because the digital signal is stepped from one quantization level to another. However, for most practical purposes a tracking A/D converter may be considered continuous.

One disadvantage of the prior art tracking or continuous A/D converters is that their response to rapidly varying input signals is often too slow. That is, the counter generally counts clock pulses to count up or down so that the counter is changed by one count each clock pulse. If the input signal varies too rapidly, the counter will lag behind. This problem can be partly alleviated by increasing the clock frequency. However, there is a practical limit to the clock frequency and high speed components greatly increase cost. Furthermore, there will still be an undersirable lag if the input signal changes too rapidly. For example, when the input signal is first applied to the converter, it will require a number of clock periods equal to the initial value of the signal before the converter "catches up" to the input signal. As an example, assume that the initial value of the analog input signal is to be represented by a count of 1000. It will require 1000 clock pulses before the counter catches up to the input signal provided the input signal does not change in the meantime.

In this invention a tracking or continuous A/D converter is provided which has the capability of advancing the up/down counter by more than one count each clock period if the difference between analog representation of the digital signal in the counter and the analog input signal is greater than a predetermined magnitude. The comparison circuit or comparator section of the converter provides at least one output signal indicative of the difference between the analog representation of the digital signal contained in the counter and analog input signal. A level detector or sensing means receives this output signal and if the output signal is greater than a preselected magnitude, the counter is forced to advance by a count greater than one.

Accordingly, it is an object of this invention to provide a new and improved A/D converter.

It is a further object of this invention to provide a tracking A/D converter which contains an up/down counter and which has a capability of advancing the up/down counter by a count greater than one.

These and other objects and advantages of this invention will become evident to those skilled in the art upon a reading of this specification and the appended claims in conjunction with the drawings of which:

STRUCTURE OF FIGURE 1

Figure 1:
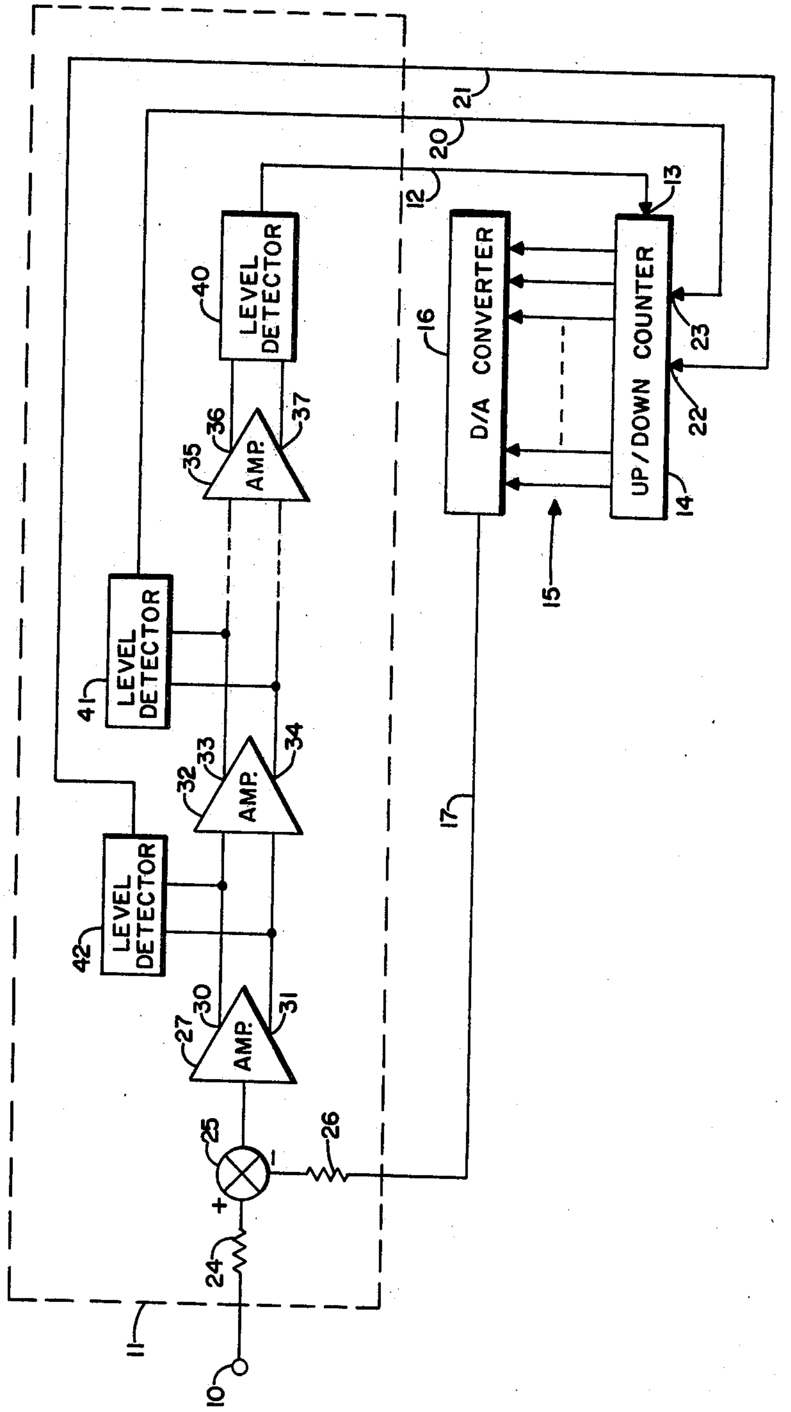
FIGURE 1 is block diagram illustrating the preferred embodiment of this invention.

In FIGURE 1 there is shown an input terminal 10 adapted to receive an analog input signal. Input terminal 10 is connected to an input of a sensing and discriminating means, comparison means, or comparator 11. Comparator 11 provides an output signal on a lead 12 which is connected to an input 13 of an up/down or reversing counter 14. Reversing counter 14 may be a multistage binary counter or a binary coded decimal counter or a similar counting unit. Counter 14 provides digital output signals on leads 15 which are coupled to the inputs of a digital-to-analog (D/A) converter 16. Converter 16 provides an output signal which is an analog representation or indication of the digital signal applied thereto. This output signal is coupled by a lead 17 to a second input of comparator 11.

The portion of FIGURE 1 described thus far is similar to that shown in a patent to C. B. Forrest, et al. 2,836,356.

Comparator 11 provides second and third output signals on leads 20 and 21, respectively, which are respectively connected to second and third inputs 23 and 22 of counter 14.

Comparator 11 will now be described in more detail. Terminal 10 is connected by means of a resistor 24 to a first input of a summing junction or summer 25. Lead 17 is connected to a second input of summer 25 by means of a resistor 26. An output of summer 25 is connected to an input of an amplifier 27. The first input of summer 25 is labeled plus and the second input is labeled minus to indicate that summer 25 forms the difference between the two signals applied thereto and applies that difference to the input of amplifier 27. Amplifier 27 has a first output 30 and a second output 31 which are connected to first and second inputs of an amplifier 32. Amplifier 32 has a first output 33 and a second output 34. A third amplifier 35 has a first output 36 and a second output 37. Outputs 33 and 34 of amplifier 32 are shown as connected to first and second inputs of amplifier 35 by broken lines. The broken lines indicate that as many stages of amplification as is desired may be inserted between amplifiers 32 and 35. Alternatively, fewer stages of amplification than those shown may be used.

Outputs 36 and 37 of amplifier 35 are connected to first and second inputs of a comparator means, level sensing means, level detecting means, or level detector 40 which has an output connected to lead 12. Outputs 33 and 34 of amplifier 32 are connected to first and second inputs of a comparator means, level sensing means, level detecting means, or level detector 41 which has an output connected to lead 20. Outputs 30 and 31 of amplifier 27 are connected to first and second inputs of a comparator means, level sensing means, level detecting means, or level detector 42 which has an output connected to lead 21.

OPERATION OF FIGURE 1

To understand the operation of FIGURE 1 assume first that the analog signals applied to both terminals of summer 25 are substantially equal in magnitude so that summer 25 provides a substantially null output signal to amplifier 27. When the analog input and the analog representation of the digital signal contained in counter 14, i.e., the analog feedback signal, are substantially equal, it indicates that the digital signal contained in counter 14 is an accurate representation of the analog input signal. Under these conditions the converter may operate in one of two manners. The level detector 40 may be designed such that it will not provide any signal on lead 12 to counter 14 so that counter 14 will not count and will then remain in the same state until the analog input signal applied to terminal 10 changes. Alternatively, level detector 40 may provide a signal to counter 14 to cause counter 14 to count up by one count and then provide a signal to counter 14 to cause counter 14 to count down by one count. In this mode of operation the lowest order state of counter 14 will be continuously changing state each clock pulse. The lowest order stage in this mode of operation is sometimes referred to as a dither bit which may be ignored or not used as it is continuously oscillating.

It will now be assumed that the analog signal applied to input terminal 10 is greater than the analog feedback signal on lead 17. Summer 25 will provide an output signal indicative of the difference between the two analog input signals. This difference or error will be amplified by the amplifier chain and applied to level detector 40. Level detector 40 will provide an output signal to counter 14 which will cause counter 14 to count in an increasing direction or sense. Counter 14 will continue to count until the two analog signals are approximately in balance.

It will now be assumed that the analog feedback signal on lead 17 is greater than the analog input signal applied at terminal 10. In this case the signal from summer 25 to amplifier 27 will be of the opposite sense or polarity so that the amplifier chain will provide a signal to level detector 40 of the opposite sense which will cause level detector 40 to provide a count down output signal to counter 14. This signal will cause counter 14 to count in a decreasing direction or sense until the two analog signals are approximately in balance.

The output signal from level detector 40 will cause counter 14 to advance by one count each clock pulse with the direction of counting being controlled by the sense of the signal on lead 12. However, if the analog feedback signal and analog input signals are greatly different so that summer 25 provides a large difference or error signal to amplifier chain, it will take a large number of clock pulses before counter 14 will be able to catch up to the analog input signal. Level detector 41 is set to discriminate or detect signals applied thereto which are greater than a predetermined magnitude. As the signal taken from amplifier 32 is dependent upon the magnitude of the difference between the analog feedback signal and the analog input signal, level detector 41 will provide an output signal on lead 20 when the difference is greater than a predetermined amount. The signal from level detector 41 is applied via lead 20 to input 23 of counter 14 and causes counter 14 to advance by more than one count each clock pulse so that counter 14 will catch up to the analog input signal faster.

Level detector 42 may be set to detect even larger difference or error signals than level detector 41 and will provide an output signal on lead 21 to advance counter 14 even faster than the output signal from level detector 41. Accordingly, it is evident that any number of level detectors could be used to discriminate between various signal levels and to advance counter 14 by varying counts depending upon the magnitude of the difference between the analog feedback signal and the analog input signal. The number of amplifiers in the amplifier chain and the particular connection of the level detectors to the amplifiers may be varied as will be evident to those skilled in the art. For example, two level detectors could be connected to the output of amplifier 27 with each level detector set to detect a different signal level.

In this connection it should be noted that the specific circuit used for level detectors 40, 41 and 42 may be any circuit capable of detecting the voltage level which exceeds a predetermined magnitude. For example, Schmidt triggers could be used but the invention is not to be limited to use of Schmidt triggers as level detectors.

STRUCTURE OF FIGURE 2

Figure 2A:
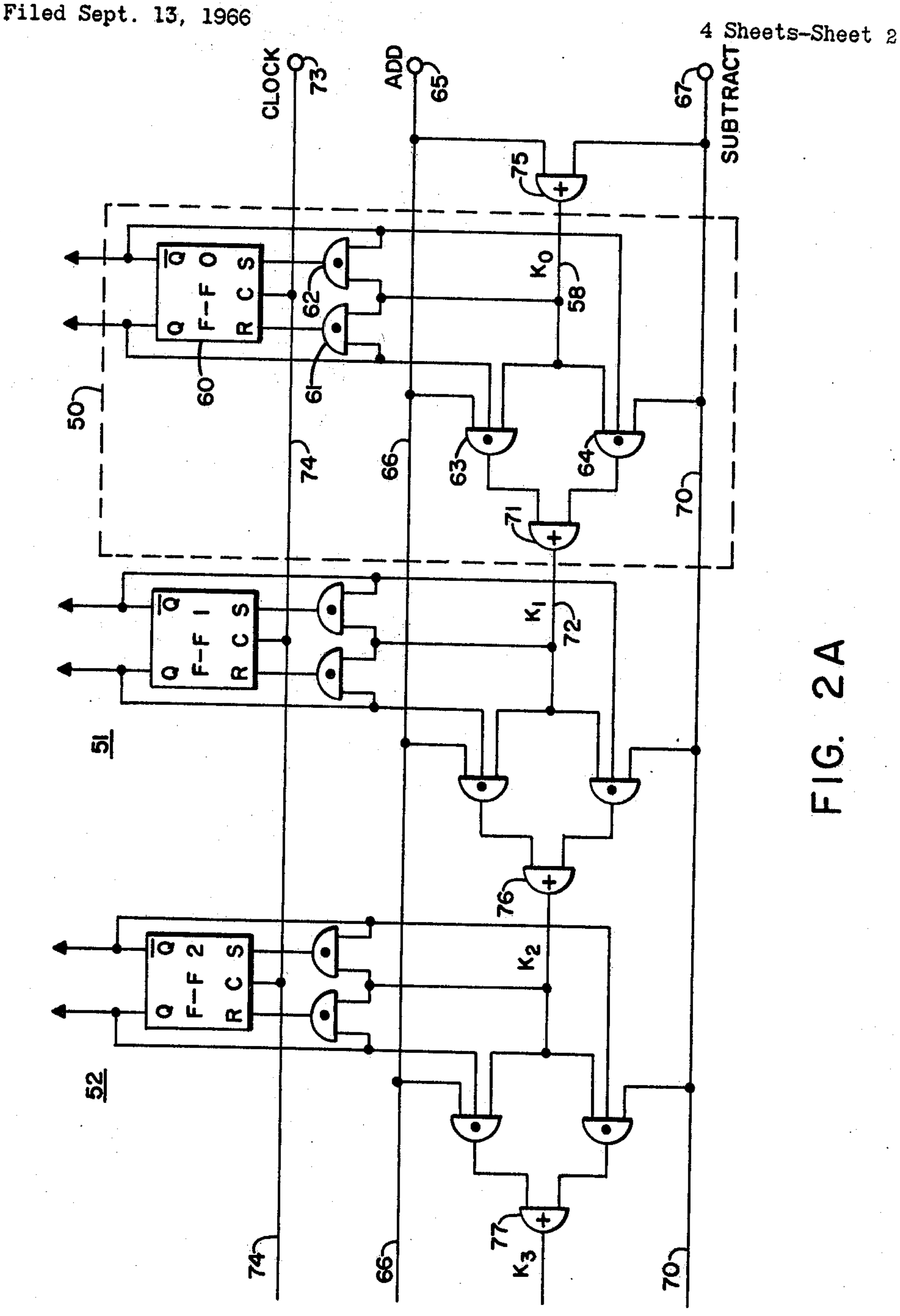
FIGURE 2 is a logic diagram of an up/down or reversing counter and is broken into portions labeled FIGURES 2A and 2B for drafting simplification.
Figure 2B:
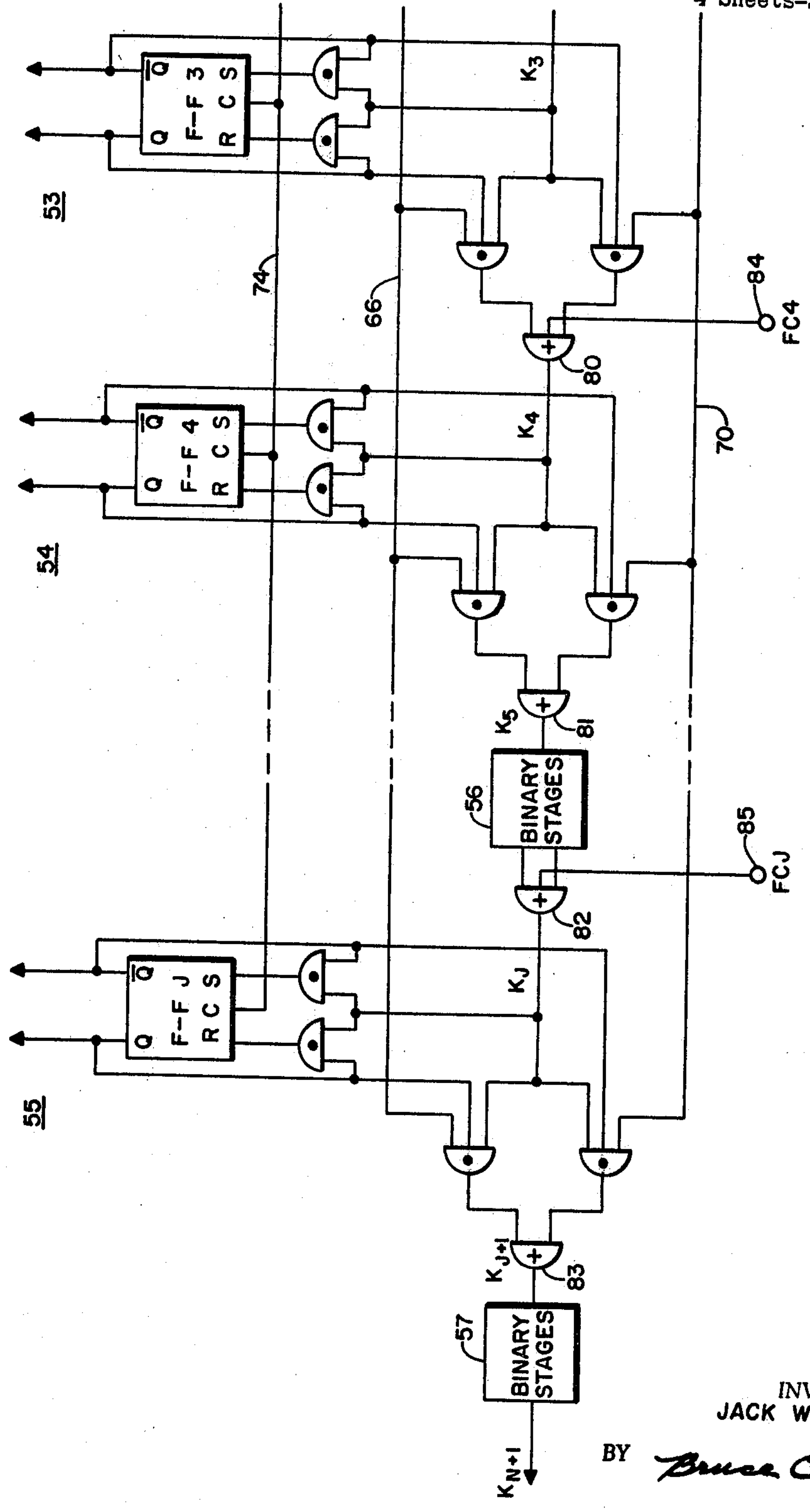

The invention will be discussed further in connection with FIGURE 2. FIGURE 2 illustrates a counting circuit which may be used for up/down counter 14 and further illustrates a method of applying the signals from level detectors 41 and 42 to the counter. The counter in FIGURE 2 consists of a plurality of binary stages arranged as a binary counter. However, it is to be realized that a counter which can count in a binary coded decimal notation may also be used.

The counter circuit of FIGURE 2 comprises a plurality of binary stages 50–57. Stage 50 is lowest order stage which may be a dither stage as was discussed previously. Alternatively, a dither bit stage could be inserted ahead of stage 50. The output from a stage 50 indicates $2^0$ in binary positional notation. Stage 51 is connected to receive the carry bit output from stage 50. The output from stage 51 indicates $2^1$ in binary positional location. Stage 52 is connected to receive the carry bit output from stage 51. The output from stage 52 indicates $2^2$ in binary positional notation. Stage 53 is connected to receive the carry bit output from stage 52. The output from stage 53 indicates $2^3$ in binary positional notation. Stage 54 is connected to receive the carry bit output from stage 53. The output from stage 54 indicates $2^4$ in binary positional notation. Between stage 54 and stage 55 is an arbitrary number of stages. Block 56 labeled Binary Stages represents an arbitrary number of stages in the counter. The last stage included within block 56 provides a $K_J$ carry bit output which is coupled to stage 55. The output of stage 55 indicates $2^J$ in binary position notation where J is a number greater than 4. A carry bit output of stage 55 is coupled to a block 57 labeled Binary Stages which represents an arbitrary number of higher order stages. It is to be realized that any number of stages can be used in the counter circuit 14 of FIGURE 1.

The basic component of each of the counter stages is a bi-stable circuit or flip-flop. The first stage 50 is centered around flip-flop 60 which has an S or set input, an R or reset input, a C input, a Q output and a $\overline{Q}$ output.

The Q and $\overline{Q}$ outputs are logical inverses of each other. The flip-flop 60 of stage 50 is labeled F—F O to indicate that the Q output represents $2^0$ in binary positional notation.

The Q output of flip-flop 50 is connected to a first input of an AND gate 61 which has an output connected to the R input of flip-flop 60. The $\overline{Q}$ output of flip-flop 60 is connected to a first input of an AND gate 62 which has an output connected to the S input of flip-flop 60. A carry input lead 58 is connected to second inputs of each of AND gates 61 and 62. Lead 58 is further connected to first inputs of each of AND gates 63 and 64. The Q output of flip-flop 60 is connected to a second output of AND gate 63 and the $\overline{Q}$ output is connected to a second input of AND gate 64. An Add input terminal 65 is connected to a lead 66 which is further connected to a third input of AND gate 63. A Subtract input terminal 67 is connected to a lead 70 which is further connected to a third input of AND gate 64. AND gates 63 and 64 each have outputs connected to first and second inputs, respectively, of an OR gate 71. OR gate 71 has an output connected to a lead 72. A clock input terminal 73 is connected to a lead 74 which is further connected to the C input of flip-flop 60. Flip-flop 60, AND gate 61, AND gate 62, AND gate 63, AND gate 64, and OR gate 71 comprise the first or lowest order stage or stage 50 of the counter circuit. The signal on lead 58 is the zero order carry signal $K_0$. This signal is generated by an OR gate 75 which has first and second inputs connected to leads 66 and 70, respectively.

The output from OR gate 71 on lead 72 provides a $K_1$ carry output signal to stage 51. Stages 51–57 are constructed the same as stage 50 with a similarly connected flip-flop and the same arrangement of OR and AND gates. Stage 51 has an OR gate 76 which provides a $K_2$ carry output signal to stage 52. Stage 52 has an OR gate 77 which provides a $K_3$ carry output signal to stage 53. Stage 53 has an OR gate 80 which provides a $K_4$ carry output signal to stage 54. Stage 54 has an OR gate 81 which provides a $K_5$ carry output signal to the next higher order stage. The last stage included within block 56 has an OR gate 82 which provides a $K_J$ carry output signal to stage 55. Stage 55 has an OR gate 83 which provides a $K_{J+1}$ output signal to the next higher order stage. The highest order stage in the counting chain provides a $K_{N+1}$ carry output signal where N is a number greater than J. The $K_{N+1}$ carry output signal will be generated only when the counter reaches its maximal or largest count and one more pulse will cause it to go to a zero count. The counter circuit will only reach its maximal count if the input signal is large so that it would be undesirable to have the counter recycle. Accordingly, the $K_{N+1}$ carry signal may be used to inhibit further counting when the counter reaches its maximal count.

A terminal 84 adapted to receive a fast carry signal which may be the signal on lead 20 of FIGURE 1 is connected to a third input of OR gate 80. Terminal 84 is labeled FC4 to indicate that it provides a fast carry signal which is applied to the $2^4$ binary position. An input terminal 85 which may be connected to lead 21 of FIGURE 1 is connected to a third input of OR gate 82. Terminal 85 is labeled FCJ to indicate that the signal applied to terminal 85 provides a fast carry in the Jth position. It is to be realized that more fast carries than two may be supplied to the counter or alternatively there need be only one. It is also to be understood that terminal 84 may be connected to any one of gates 71, 76, 77, or 81 or any of the equivalent OR gates in block 56 in place of the connection to OR gate 80.

OPERATION OF FIGURE 2

To understand the operation of FIGURE 2 first assume a logical "1" signal is present at terminal 65 and that all stages of the counter have logical "0" signals present at their Q outputs. The $K_0$ signal on lead 58 will then be a "1" signal. As both of the signals applied to AND gate 62 are "1" signals, a "1" signal will be present at the S input of flip-flop 60. When the next clock pulse occurs at terminal 73, flip-flop 60 will change states so the Q output becomes a logical "1." The "1" signal at the S input of flip-flop 60 will disappear and AND gate 61 will provide a "1" signal to the R input of flip-flop 60. The "1" signals on leads 66 and 58 and at the Q output of flip-flop 60 will energize AND gate 63 and OR gate 71 to provide a "1" signal on lead 72. This signal will be coupled to the S input of the flip-flop in stage 51. When the next clock pulse occurs at terminal 73, it will be coupled to the C inputs of each of the flip-flops and will again reverse the state of flip-flop 60 and will also reverse the state of the flip-flop in stage 51. The count in the counter is now 10 in binary or 2 in decimal.

To count in the reverse direction the "1" signal at terminal 65 is removed and an "1" signal is applied to terminal 67.

It is easily seen that when the counter is counting up or in an increasing direction, a carry signal will be generated by a stage if there is a carry signal present from the next lower order stage and the stage in question has a "1" signal present at the Q output of the flip-flop in that stage. The carry signals for counting down are generated when a "1" signal is present at the $\overline{Q}$ output of a flip-flop and the carry signal is present from the next lower stage.

Assume now that in addition to a logical "1" signal at terminal 65 there is also present a logical "1" signal at terminal 84 so that a $K_4$ carry signal is provided to the fourth counter stage. This carry signal will be interpreted the same as if it came from stage 53 and will cause stage 54 to count in an increasing direction. Stage 54 will provide carries to the next higher order stage and so on so that the counter will be counting by 16's as well as 1's. With "1" signals present at both terminals 67 and 84, the counter will count down in the same manner as it counted up.

Figure 3:
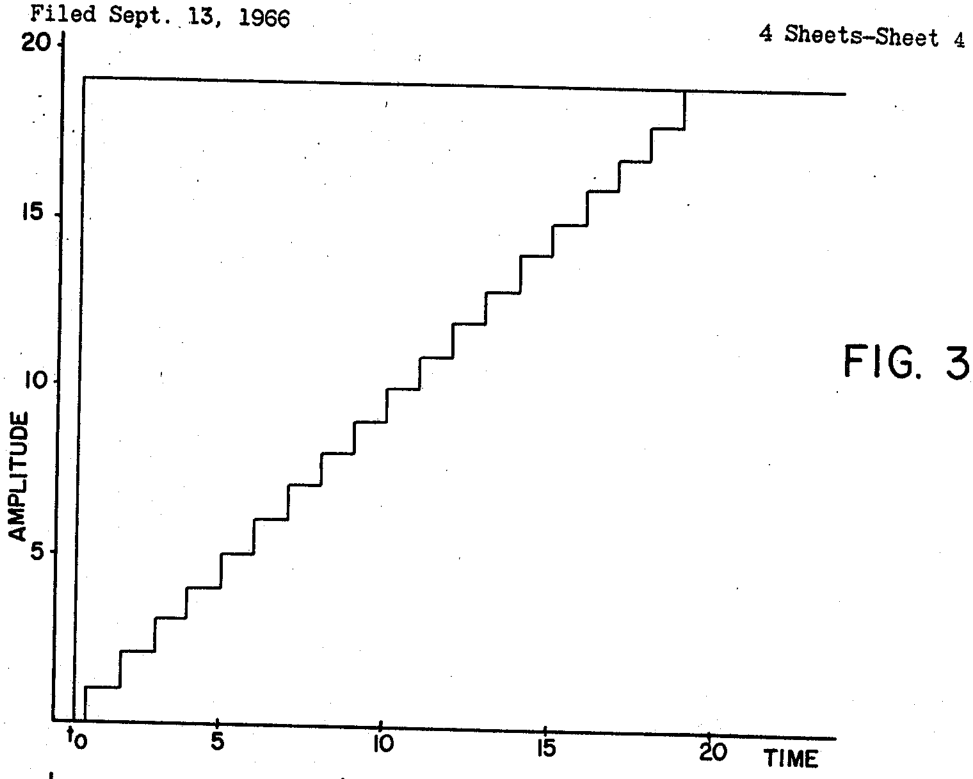
FIGURES 3, 4 and 5 are graphical illustrations of the operation of this invention.

Referring now to FIGURE 3 there is shown a graph illustrating the operation of a prior art tracking A/D converter. Assume that no fast carry signals are being generated, that the counter registers a zero count, and that at time $t_0$ a step input of 19 amplitude units is applied to the input terminal 10. It is easily seen that it will take 19 clock pulses before the counter "catches up" to the input signal.

Figure 4:
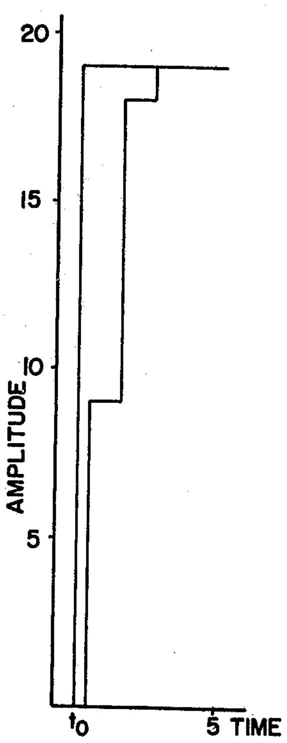

Refer now to FIGURE 4 which shows a graph illustrating the operation of tracking A/D converter with a fast carry signal in the $2^3$ binary position. In FIGURE 2 this would means a fast carry applied to OR gate 77 to generate an FC3 signal. The FC3 signal would be transmitted through OR gate 77 to generate a $K_3$ carry signal which would cause the counter to change states at both stages 50 and 53 thereby registering a count of 9. The next clock pulse would again increase the count by 9 so that a total count of 18 could be registered. The FC3 signal would then disappear and the counter would count one additional unit at the third clock pulse. Thus, with an FC3 signal in the example illustrated in FIGURES 3 and 4 only three clock pulses are required for the counter to "catch up" to the input signal rather than 19 clock pulses.

Figure 5:
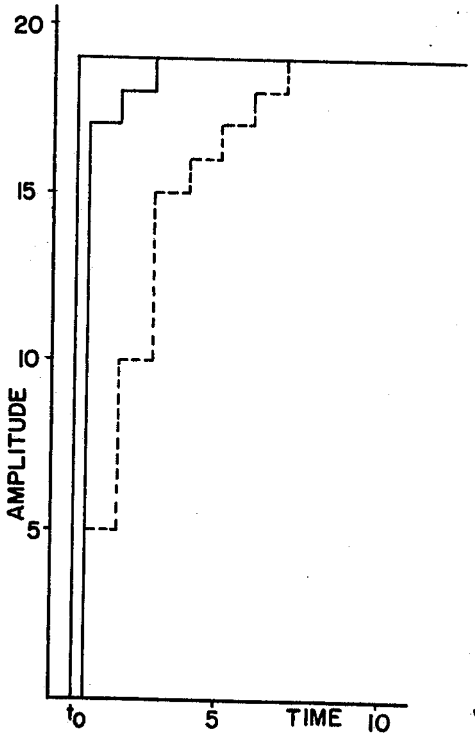

FIGURE 5 shows two more examples both using an analog input which is a step function of 19 amplitude units. The first example illustrated by the solid line assumes an FC4 signal which will cause the counter to count at both stages 50 and 54 when the first clock pulse occurs after application of the step input signal. After the first clock pulse the counter will register a count of 17 so that the FC4 signal will disappear. The counter will then count by 1's for two more clock pulses until it reaches a count of 19. In the second example shown by a broken line it is assumed that an FC2 signal is applied to OR gate 76 of FIGURE 2. An FC2 signal will cause the counter to count by four as well as counting by one for a total count of 5 each clock pulse. In this example it will take seven clock pulses before the counter "catches up" to the input signal.

Many other examples and variations of my invention could be discussed, however, they will be evident to those skilled in the art. It is to be understood that other means for advancing the counter in a tracking A/D converter could be used in place of the fast carry signals shown and described. Accordingly, my invention is not to be limited by the specific embodiment illustrated and the specific examples used but only by the scope of the appended claims.

I claim as my invention:

1. Analog to digital converter apparatus comprising:

reversible counter means having a plurality of bistable stages, each stage having gating means for generating advance signals and means connecting the gating means of each stage except the highest order stage to the next higher order stage for providing the advance signals to the next higher order stage, said counter means further having means for controlling the direction of counting;

means connected to said counter means for providing an analog feedback signal representative of the magnitude of the count of said counter means;

input means for providing an analog input signal;

comparator means connected to said input means and to said means for providing an analog feedback signal for providing control signals indicative of the sense and magnitude of the difference between said analog input signal and said analog feedback signal;

means connecting said comparator means to said counter means for coupling said control signals to said means for controlling the direction of counting;

means connected to said counter means for supplying pulses to said counter means, said counter means operable to count the pulses when a control signal from said comparator means is present;

level detecting means connected to said comparator means for providing a signal when the difference between said analog input signal and said analog feedbeck signal exceeds a predetermined magnitude; and means connecting said level detecting means to the gating means of at least one stage of said counter means of higher order than the lowest order stage for providing a forced advance signal to the gating means connected thereto.

2. Apparatus as defined in claim 1 wherein said comparator means includes a first amplifying means for amplifying the difference between said analog input signal and said analog feedback signal and a second amplifying means for further amplifying the output signal of said first amplifying means, said level detecting means being connected to the output of said first amplifying means and said control signal being provided by said second amplifying means.

3. Apparatus as defined in claim 2 including a second level detecting means for detecting when the difference between said analog input signal and said analog feedback signal exceeds a second predetermined magnitude, and means connecting said second level detecting means to the gating means of at least one stage of higher order than the gating means of the stage to which the first mentioned level detecting means is connected for providing a forced advance signal to the gating means connected thereto.

References Cited

UNITED STATES PATENTS

| | | | |
|---|---|---|---|
| 2,974,315 | 3/1961 | Lebel et al. | 340—347 |
| 3,221,324 | 11/1965 | Margopoulos | 340—347 |
| 3,241,135 | 3/1966 | Kuflik et al. | 340—347 |
| 3,295,126 | 12/1966 | Spady | 340—347 |
| 3,298,019 | 1/1967 | Nossen | 340—347 |

MAYNARD R. WILBUR, Primary Examiner

C. D. MILLER, Assistant Examiner

U.S. Cl. X.R.

235—92